United States Patent
Mizuishi et al.

[11] Patent Number: 5,833,750
[45] Date of Patent: Nov. 10, 1998

[54] CRYSTAL PULLING APPARATUS

[75] Inventors: Kouji Mizuishi, Annaka; Shigemaru Maeda, Takefu, both of Japan

[73] Assignee: Shin-Etsu Handotai Co. Ltd., Tokyo, Japan

[21] Appl. No.: 760,984

[22] Filed: Dec. 5, 1996

[30] Foreign Application Priority Data

Dec. 25, 1995 [JP] Japan ................................ 7-350038

[51] Int. Cl.$^6$ .................................................. G30B 35/00
[52] U.S. Cl. ......................... 117/218; 117/200; 117/911
[58] Field of Search ................... 117/200, 218, 117/910, 911

[56] References Cited

U.S. PATENT DOCUMENTS

| | | | |
|---|---|---|---|
| 3,159,408 | 12/1964 | Sanchez et al. | 117/911 |
| 3,191,924 | 6/1965 | Haus | 117/911 |
| 3,206,286 | 9/1965 | Bennett, Jr. et al. | 117/218 |
| 4,284,605 | 8/1981 | Pierrat | 117/218 |
| 4,738,832 | 4/1988 | Drechsel | 117/217 |

FOREIGN PATENT DOCUMENTS

| | | |
|---|---|---|
| 2562915 | 10/1985 | France . |
| 63-064992 | 3/1988 | Japan . |
| 63-206382 | 8/1988 | Japan . |
| 403103389 A | 4/1991 | Japan ...................................... 117/218 |
| 4-182381 | 6/1992 | Japan . |

*Primary Examiner*—Felisa Garrett
*Attorney, Agent, or Firm*—Oliff & Berridge, PLC

[57] ABSTRACT

A crystal pulling apparatus is disclosed in which a single crystal ingot is pulled from a melt of a crystalline material by using a cable. A crimp portion and a spherical portion supported by the crimp portion are provided in the vicinity of the tip of the cable. Two divided couplings are screwed into a chuck body of a seed chuck. The couplings have an accommodation space therein so as to accommodate the cable and the spherical portion, and conical hole sections serving as the shoulder portion of the accommodation space contact and hold the spherical portion. This structure allows the cable to rotate during crystal pulling operation and facilitates attachment of the seed chuck to the cable and removal of the seed chuck from the cable.

5 Claims, 7 Drawing Sheets

CRYSTAL PULLING APPARATUS

BACKGROUND OF THE INVENTION

1. Field of the Invention

The present invention relates to a crystal pulling apparatus used for pulling a seed crystal from a melt of a polycrystalline material to thereby obtain a single crystal.

2. Description of the Related Art

Conventionally, a pulling method (Czochralski method, hereinafter called as the "CZ" method) and a floating zone method have been known as methods for obtaining a single crystal from a polycrystalline material such as silicon. In the CZ method, a polycrystalline material is first melted, and a seed crystal is pulled from the melt of the polycrystalline material. In this method, a shaft or a cable is employed to pull the seed crystal.

FIG. 7 shows an example of a prior art crystal pulling apparatus employing a cable. As shown in FIG. 7, the crystal pulling apparatus 100 includes a chamber 101, a crucible 102 disposed within the chamber 101, a heater 105 disposed around the crucible 102, a crucible holding shaft 107 and a rotating mechanism 108 for rotating the crucible 102, a seed chuck 22 for holding a seed crystal S of silicon, a cable 1 for pulling the seed chuck 22, and a winding mechanism 109 for rotating or winding up the cable 1. The crucible 102 is composed of a quartz portion 103 for accommodating a melt L therein and a graphite portion 104 which surrounds the quartz portion 103. A heat insulating cylinder 106 is disposed around the outer circumference of the heater 105.

Next, a description will be given of a method for growing a single crystal using the above-described crystal pulling apparatus 100.

First, a highly purified polycrystalline material of silicon is heated to a temperature higher than its melting point (about 1400° C.) so as to be melted. Subsequently, the cable 1 is released out such that the tip of the seed crystal S comes into contact with or is dipped into the surface of the melt L at the substantially central portion thereof. The crucible holding shaft 107 is then rotated in a desired direction, and the cable 1 is wound up while being rotated, so as to pull the seed crystal S. In this manner, the operation for growing a single crystal is started. Subsequently, this operation is continued while the pulling speed and the temperature are properly adjusted, so that a single crystalline ingot C having a generally cylindrical shape is obtained.

FIG. 8 is a cross-sectional view showing the detailed structure of the seed chuck 22 and the end portion of the cable 1, which are used to hold the seed crystal S and suspend it from the cable 1 in the prior art crystal pulling apparatus 100.

As shown in FIG. 8, the seed chuck 22 is composed of a chuck body 23, a seed pin 24, a cable pin 29, and a nut 30. The chuck body 23 is made of a carbon material and is formed in a cylindrical shape. At the bottom of the chuck body 23 is provided a concaved portion 23H1, which has a blind-hole-like shape and extends upward from the bottom surface of the chuck body 23. The seed crystal S is fixed to the chuck body 23 by inserting the seed pin 24 into the chuck body 23 after insertion of the seed crystal S into the concaved portion 23H1. The seed pin 24 is formed of, for example, a carbon-fiber-reinforced carbon composite material or a like material.

To the tip of the cable 1 is secured an attachment 26 which has a pin hole 26H. In the upper portion of the chuck body 23 is formed a concaved portion 23H2, which has a blind-hole-like shape and extends downward from the top surface of the chuck body 23. The attachment 26 is received by the concaved portion 23H2. In the upper portion of the chuck body 23 is also formed a pin hole 23H3 which horizontally penetrates the chuck body 23. A male thread is formed at the tip of the cable pin 29, while a female thread is formed in the nut 30.

Accordingly, the seed chuck 22 can be attached to the cable 1 by inserting the cable pin 29 into the pin hole 23H3 after insertion of the attachment 26 into the concaved portion 23H2 and by subsequently attaching and tightening the nut 30.

However, in the above-described conventional crystal pulling apparatus, since the connecting portion between the cable and the chuck is asymmetrical with respect to the center line of the cable, "deflection" is produced due to eccentricity when the cable is rotated during the operation for pulling a single crystal.

Moreover, the diameter of the cable pin cannot be increased very much because of the strength of the upper portion of the chuck body and other restrictions. Therefore, when the chuck is used for a prolonged period of time in a high temperature atmosphere in the vicinity of the melt, "sticking" occurs between the cable pin and the nut. If such sticking occurs, a prolonged period of time is required to remove the cable from the seed chuck for replacement of the cable or the like.

SUMMARY OF THE INVENTION

The present invention has been accomplished to solve the above-mentioned problems, and it is an object of the invention to provide a crystal pulling apparatus which allows a cable to freely rotate during the operation for pulling a single crystal and which makes it easier to attach the cable to a seed chuck and remove it from the chuck.

The present invention is a crystal pulling apparatus which includes a cable which is vertically movable above a melt of a crystalline material, and a seed crystal holder which is attached to the cable so as to hold a seed crystal. The cable is moved downward so as to cause the seed crystal to contact the melt and is subsequently pulled so as to grow a single crystal of the crystalline material. An attachment having a surface of revolution whose axis of rotation symmetry coincides with the center line of the cable is attached to the cable in the vicinity of the tip thereof. A support member composed of a plurality of members is detachably attached to the seed crystal holder. The support member has an accommodation space therein so as to accommodate the cable and the attachment member, and the shoulder portion of the accommodation space contacts and holds the attachment member.

In the crystal pulling apparatus according to the present invention, the connecting portion between the cable and the seed crystal holder becomes symmetrical with respect to the center line of the cable, so that deflection of a single crystal undergoing pulling operation can be prevented.

Further, the seed crystal holder can easily be removed from the cable.

Preferably, the attachment member has a crimp portion to be fixed to the cable in the vicinity of the tip thereof through crimping, and a spherical portion which is attached to the cable through the crimp portion. The support member is composed of two members, and is removably attached through screw engagement to the upper portion of the seed crystal holder. The shoulder portion of the accommodating space forms a space having the shape of a truncated cone.

Preferably, the seed crystal holder consists of first and second members. The first member holds the seed crystal, the second member is detachably attached to the upper portion of the first member through screw engagement, and the supporter is detachably attached to the upper portion of the second member through screw engagement.

BRIEF DESCRIPTION OF THE DRAWINGS

Various other objects, features and many of the attendant advantages of the present invention will be readily appreciated as the same becomes better understood by reference to the following detailed description of the preferred embodiments when considered in connection with the accompanying drawings, in which.

DESCRIPTION OF THE PREFERRED EMBODIMENTS

Embodiments of the present invention will now be described in detail with reference to the drawings.

Figure 1:
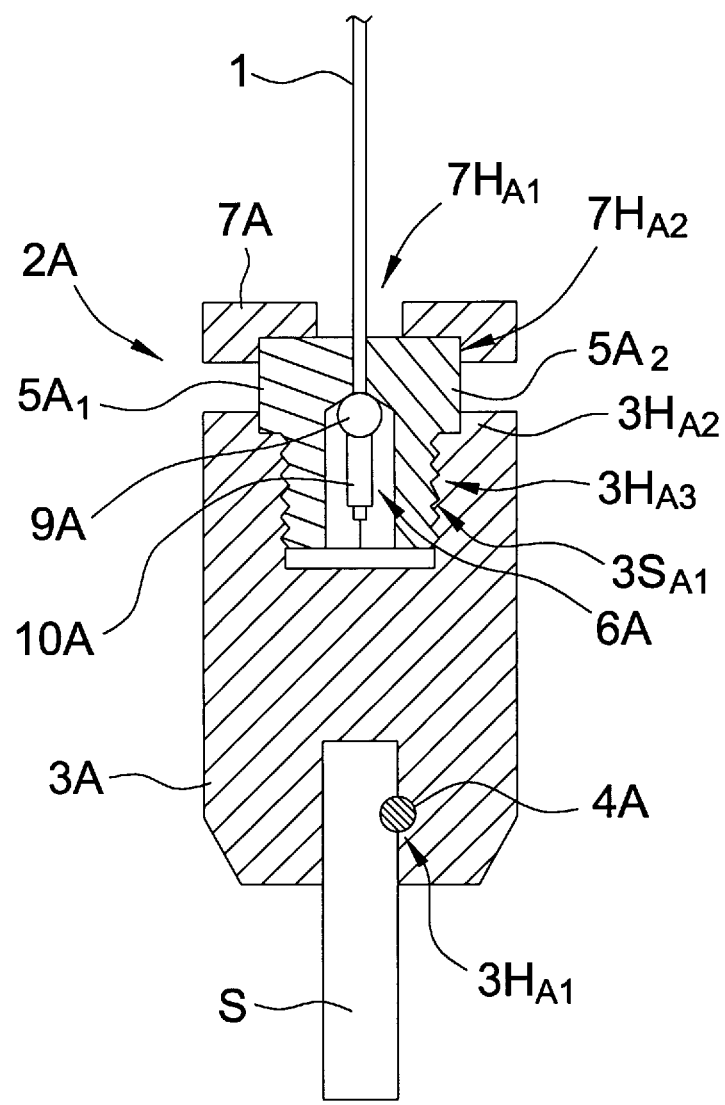
FIG. 1 is a sectional view showing the detailed structures of a seed chuck, the tip of a cable and their neighboring portions in a first embodiment of a crystal pulling apparatus according to the present invention.
Figure 2:
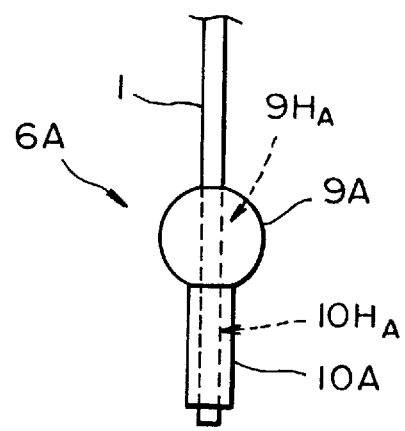
FIG. 2 is a side view showing the further detailed structure of the tip of the cable shown in FIG. 1.
Figure 3:
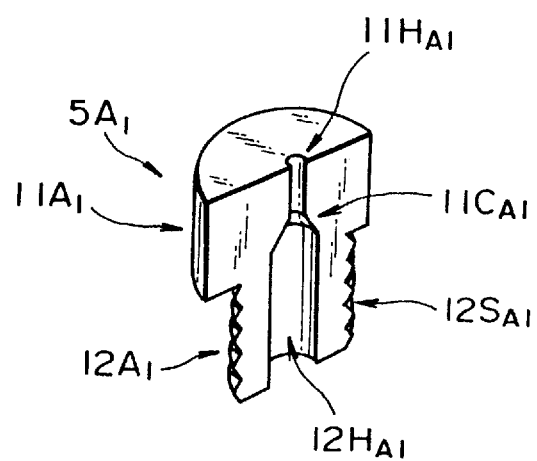
FIG. 3 is a perspective view showing the further detailed structure of the seed chuck shown in FIG. 1.

FIG. 1 shows the sectional structures of a seed chuck, the tip of a cable, and their neighboring portions in a first embodiment of a crystal pulling apparatus according to the present invention. FIG. 2 shows a detailed side view of the tip of the cable, while FIG. 3 shows a detailed perspective view of the seed chuck. Parts other than the seed chuck and the tip of the cable have structures the same as those shown in FIG. 7.

As shown in FIGS. 1–3, the crystal pulling apparatus of the first embodiment includes a seed chuck 2A and an attachment member 6A to be attached to the tip of a cable 1.

The seed chuck 2A is composed of a chuck body 3A, a seed pin 4A, couplings 5A1 and 5A2, and a cap 7A. The chuck body 3A is made of a carbon material and is formed in a generally cylindrical shape. At the bottom of the chuck body 3A is provided a concaved portion 3HA1, which has a blind-hole-like shape and extends upward from the bottom surface of the chuck body 3A. A seed crystal S is fixed to the chuck body 3A by inserting the seed pin 4A into the chuck body 3A after insertion of the seed crystal S into the concaved portion 3HA1. The seed pin 4A is formed of, for example, a carbon-fiber-reinforced carbon composite material or a like material.

To the tip of the cable 1 is secured an attachment member 6A. This attachment member 6A is made of a metal such as molybdenum, and has a spherical portion 9A and a cylindrical crimp portion 10A integrally formed below the spherical portion 9A. The spherical portion 9A has a through hole 9HA which vertically penetrates the spherical portion 9A. The crimp portion 10A has a through hole 10HA which communicates with the through hole 9HA and which vertically penetrates the crimp portion 10A. The tip of the cable 1 is passed through these through holes 9HA and 10HA, and the crimp portion 10A is then crimped using an unillustrated tool or the like so as to be fixed to the tip of the cable 1 (see FIG. 2).

Each of the couplings 5A1 and 5A2 has a shape which is obtained by dividing a generally bolt-shaped member into two portions having the same shape. Since both the couplings 5A1 and 5A2 have the same structure, only the coupling 5A1 will be described hereinafter. The coupling 5A1 is made of a metal such as molybdenum, and has a semi-cylindrical head portion 11A1 and a semi-cylindrical tail portion 12A1 whose radius is smaller than that of the head portion 11A1.

On the curved side of the semi-cylindrical peripheral surface of the tail portion 12A1 is formed a mail thread 12SA1 (see FIG. 3).

On the flat side of the semi-cylindrical peripheral surface of the coupling 5A1 are formed a cable hole 11HA1, a conical hole section 11CA1 communicating with the cable hole 11HA1, and an accommodation hole section 12HA1.

The cable hole 11HA1 is formed by a groove having a semi-circular cross section. The center of the semi-circle of the groove coincides with the center of the semi-circle of the head portion 11A1. The diameter of the semi-circle of the groove is slightly larger than the outer diameter of the cable 1. The conical hole section 11CA1 is formed by a groove having a semi-circular cross section whose radius is the same as that of the cable hole 11HA1 at the boundary between the cable hole 11HA1 and the conical hole section 11CA1 and increases linearly toward the accommodation hole section 12HA1. The conical hole section 11CA1 has a shape which is obtained by bisecting a shape of a truncated cone. The accommodation hole section 12HA1 is formed by a groove having a semi-circular cross section. The center of this semi-circle coincides with the center of the semi-circle of the tail portion 12A1, and the diameter of the semi-circle of the accommodation hole section 12HA1 is equal to the diameter at lower end of the conical hole section 11CA1 (see FIG. 3).

The other coupling 5A2 has the same structure as that of the above-described coupling 5A1. That is, the coupling 5A2 has a semi-cylindrical head portion 11A2 (not illustrated), and a tail portion 12A9 (not illustrated). On the curved side of the tail portion 12A2 (not illustrated) is formed a male thread 12SA2 (not illustrated), while on the flat side of the coupling 5A2 are formed a cable hole 11HA2 (not illustrated), a conical hole section 11CA2 (not illustrated), and an accommodation hole section 12HA2 (not illustrated).

The head portion 11A2 (not illustrated) corresponds to the head portion 11A I shown in FIG. 3; the tail portion 12A2 (not illustrated) corresponds to the tail portion 12A1 shown in FIG. 3; the male thread 12SA2 (not illustrated) corresponds to the male thread 12SA1 shown in FIG. 3; the cable hole 11HA2 (not illustrated) corresponds to the cable hole 11HA1 shown in FIG. 3; the conical hole section 11CA2 (not illustrated) corresponds to the conical hole section 11CA1 shown in FIG. 3; and the accommodation hole section 12HA2 (not illustrated) corresponds to the accommodation hole section 12HA1 shown in FIG. 3.

In the upper portion of the chuck body 3A are formed a concaved portion 3HA2 which extends downward from the upper surface of the chuck body 3A to have a dish-like or a ring-like cross section, and a concaved portion 3HA3 which has a blind-hole-like shape and extends downward from the concaved portion 3HA2. A female thread 3SA1 is formed on the inside surface of the concaved portion 3HA3 (see FIG. 1).

The spherical portion 9A and the crimp portion 10A of the attachment member 6A, which has been attached to the cable 1 through crimping operation as described above, are sandwiched between the couplings 5A1 and 5A2 so as to be accommodated within a generally cylindrical space which is formed by the conical hole section 11CA1, the unillustrated conical hole section 11CA2, the accommodation hole 12HA1, and the unillustrated accommodation hole 12HA2 of the couplings 5A1 and 5A2. The couplings 5A1 and 5A2 are brought into close contact with each other, and the male thread 12SA1 and the unillustrated male thread 12SA2 of the couplings 5A1 and 5A2 are brought into screw engagement with the female threads 3SA1. Subsequently, the couplings 5A1 and 5A2 are tightened, whereby the tip of the cable 1 can be attached to the chuck body 3A.

In the above-described structure, the connecting portion between the cable 1 and the sand the seed chuck 2A is symmetrical with respect to the center 1, and the spherical portion 9A contacts the internal surfaces of the conical hole sections 11CA1 and 11CA2 through a circular contact line. Therefore, when the cable 1 has a "bend" or when the seed chuck 2A slightly inclines with respect to the vertical direction, the position and orientation of the seed chuck 2A are corrected such that the center line of the seed chuck 2A lies in the vertical direction, once a vertical force acts on the seed chuck 2A in such a direction as to pull it downward. This correction is effected due to imbalance in the forces generated at contact points where the spherical portion 9A contacts the conical hole sections 11CA1 and 11CA2.

Accordingly, it is possible to prevent generation of "deflection" which would otherwise be produced when the cable is rotated during the operation for pulling a single crystal.

Moreover, the seed chuck 2A can easily be removed from the cable 1 compared with the case of the conventional seed chuck.

Furthermore, even in the case where a melt L solidifies during crystal pulling operation and a single crystal ingot C is therefore fixed to the solidified melt L, "sliding" in the rotational direction around the center line of the cable can be effected at the contact points between the spherical portion 9A and the conical hole sections 11CA1 and 11CA2. Accordingly, it is possible to prevent various portions of the crystal pulling apparatus from being damaged.

Due to the weight of a single crystal being pulled, the above-described couplings 5A1 and 5A2 are subjected not only to a vertical component force but also to a horizontal component force. Since the horizontal component force wedges the spherical portion 9A into the cable holes 11HA1 and 11HA2 so that the couplings 5A1 and 5A2 are separated from each other in a horizontal direction, there is a possibility of the connection between the cable 1 and the seed chuck 2 being broken. In order to overcome this problem, as shown in FIG. 1, a cap 7A is attached to the couplings 5A1 and 5A2. The cap 7A has a cable hole 7HA1 which penetrates the cap 7A, as well as a concaved portion 7HA2 which has a dish-like or ring-like shape and faces downward. The cap 7A is fitted onto the upper portions of the couplings 5A1 and 5A2 so as to fix the upper portions of the couplings 5A1 and 5A2 and to bear the horizontal component force, which acts on the couplings 5A1 and 5A2 due to the wedging of the spherical portion 9A. This structure improves safety. When the cap 7A is attached, it is necessary to sandwich the attachment member 6A between the couplings 5A1 and 5A2, after the attachment member 6A attached to the tip of the cable 1 is passed through the cable hole 7HA1 of the cap 7A.

Next, a method of manufacturing the above-described couplings 5A1 and 5A2 will be described with reference to FIGS. 4A–4D.

Figure 4A:
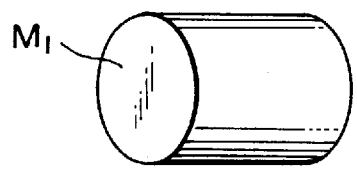
FIGS. 4A–4D are diagrams for illustrating a first method of manufacturing the coupling shown in FIG. 1.
Figure 4B:
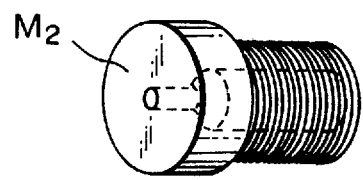
Figure 4C:
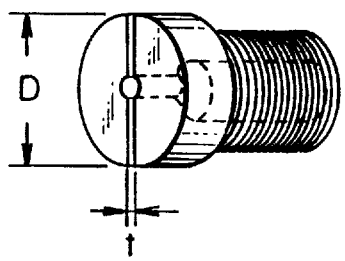

A bar-shaped material M1 (FIG. 4A) is subjected to cutting so as to form a generally bolt-shaped intermediate M2 (FIG. 4B). Through use of an unillustrated cutter or the like, this intermediate M2 is cut along the center thereof so that two equally parts are obtained. A cable hole, a conical hole section and an accommodation hole section are formed on the flat-side surface of each of the divided parts (FIG. 4C), so that two couplings are completed.

Figure 4D:
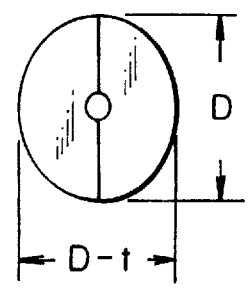

However, when the couplings are manufactured using this method, a portion of the intermediate M2 having a thickness t corresponding to the thickness of the unillustrated cutter is lost as chips or the like. Therefore, when the two couplings are brought into close contact, they form an incomplete cylindrical shape in which the diameter becomes D at the portion which is not affected by the cutting and the diameter becomes (D-t) at the portion which is affected by the cutting (FIG. 4D). When the pair of engaged couplings does not have a true cylindrical cross section, play is produced between the couplings and the chuck body, and it becomes impossible to screw the male thread portions of the couplings into the chuck body. In addition, this becomes a cause of damage of thread ridges and roots of threads or a cause of falling of the seed chuck.

In order to solve the above-described problem, it is preferred that the couplings be manufactured using a method shown in FIG. 5.

Figure 5A:
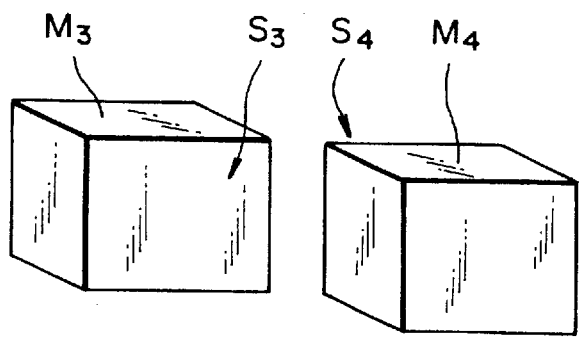
FIGS. 5A–5D are diagrams for illustrating a second method of manufacturing the coupling shown in FIG. 1.
Figure 5B:
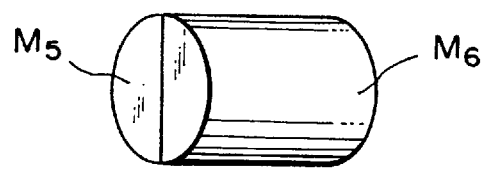
Figure 5C:
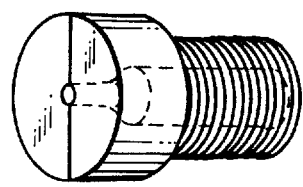

That is, two square-bar-like materials M3 and M4 are prepared, and one surface S3 of the material M3 and one surface S4 of the material M4 are subjected to mirror finish (FIG. 5A). Subsequently, the materials M3 and M4 are chucked at their ends such that the surfaces S3 and S4 come into close contact and such that the centers of the contacted surfaces S3 and S4 coincide with the rotational center. In this state, the materials M3 and M4 are cut into materials M5 and M6 which together have a cylindrical shape (FIG. 5B). Subsequently, the materials M5 and M6 are subjected to further cutting so as to obtain intermediates which together have a generally bolt-like shape, and the intermediates are separated from each other. A cable hole, a conical hole section and an accommodation hole section are formed on the flat-side surface of each of the intermediates (FIG. 5C).

Figure 5D:
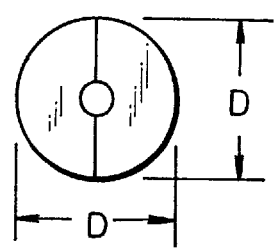

In the case where the couplings are manufactured in the above-described manner, when the two couplings are closely contacted together, the diameter becomes D at all circumferential positions, so that a complete circular cross section can be obtained (FIG. 5D).

Next, a description will be given of a second embodiment of the present invention.

Figure 6:
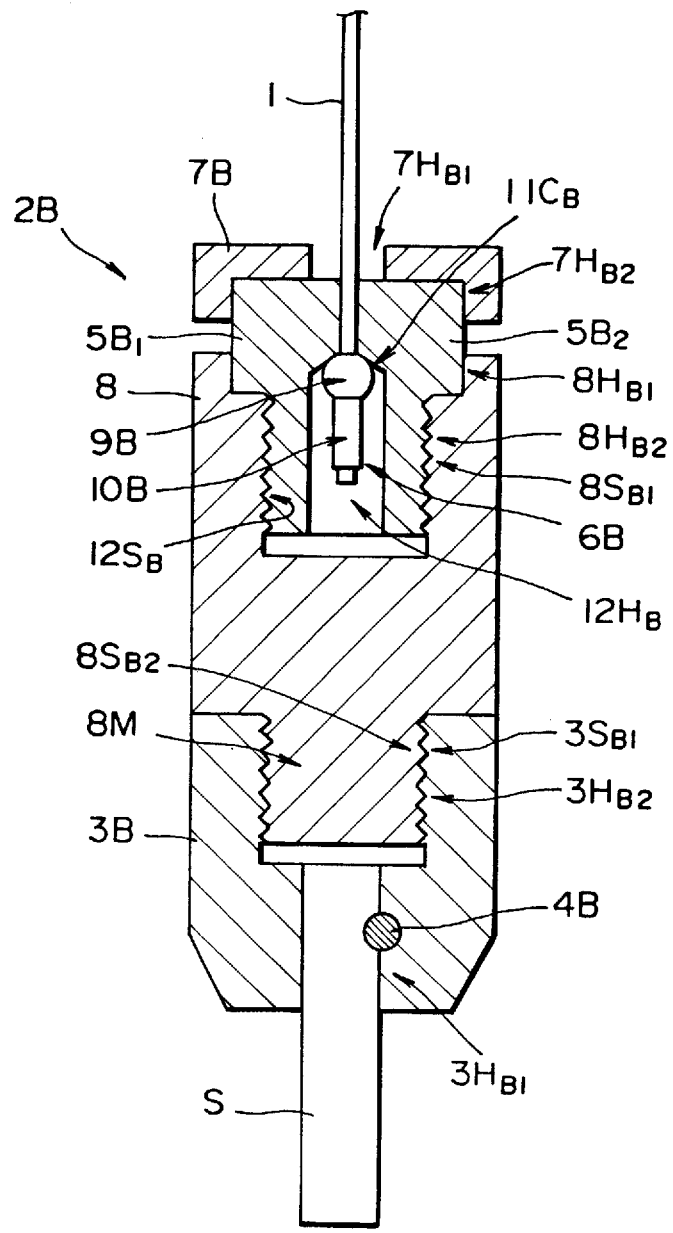
FIG. 6 is a sectional view showing the detailed structures of a seed chuck, the tip of a cable and their neighboring portions in a second embodiment of the crystal pulling apparatus according to the present invention.

FIG. 6 shows the sectional structures of a seed chuck, the tip of a cable and their neighboring portions in a second embodiment of the crystal pulling apparatus according to the present invention. Parts other than the seed chuck and the tip of the cable have structures the same as those shown in FIG. 7.

Figure 7:
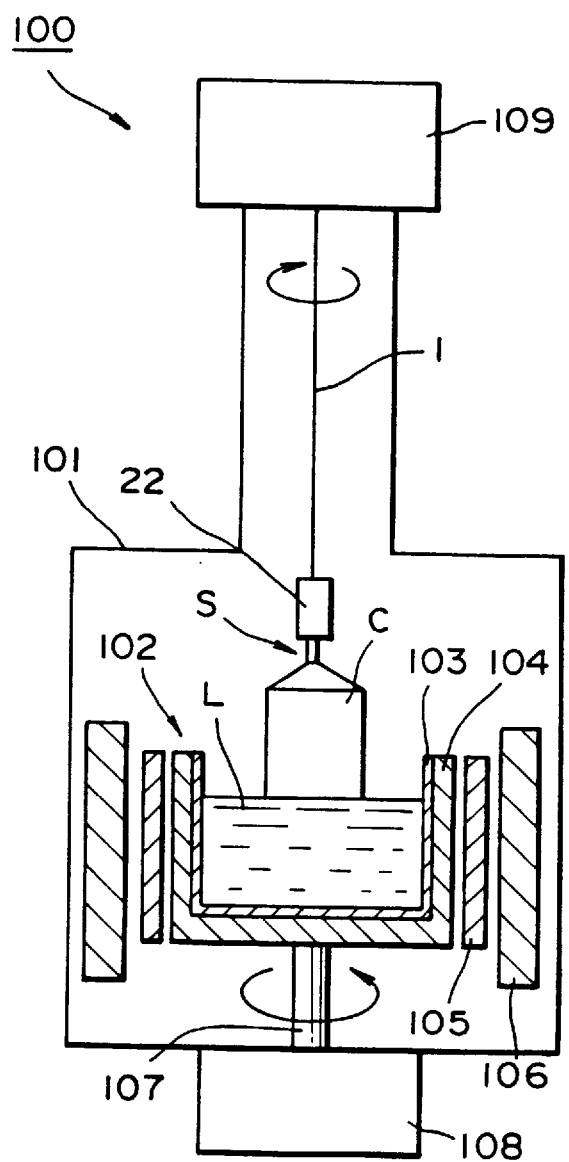
FIG. 7 is a sectional view showing the entire structure of a crystal pulling apparatus.
Figure 8:
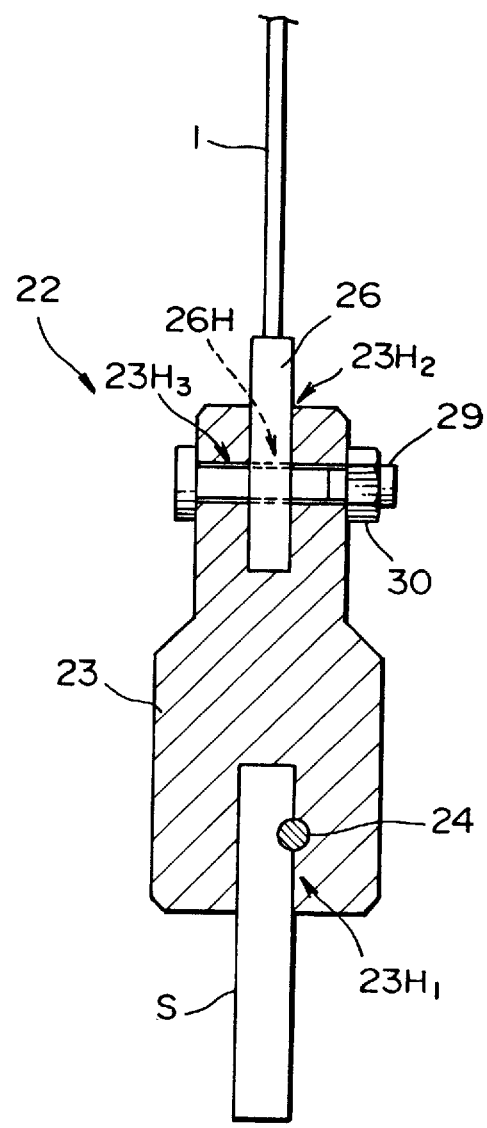
FIG. 8 is a sectional view showing the detailed structures of a seed chuck, the tip of a cable and their neighboring portions in a conventional crystal pulling apparatus.

As shown in FIG. 7, the crystal pulling apparatus of the second embodiment includes a seed chuck 2B and an attachment member 6B to be attached to the tip of a cable 1.

The seed chuck 2B is composed of a chuck body 3B, a seed pin 4B, couplings 5B1 and 5B2, and a cap 7B.

The second embodiment differs from the first embodiment in that a chuck body 3B made of a carbon material and formed in a generally cylindrical shape and a holder 8 made of a metal such as molybdenum are used in place of the chuck body 3A and in that the chuck body 3B and the holder 8 are joined together through screw engagement.

The seed pin 4B, the couplings 5B1 and 5B2, the cap 7B, and the attachment member 6B, which are parts other than the chuck body 3B and the holder 8, have the same structures as those of the seed pin 4A, the couplings 5A1 and 5A2, the cap 7A, and the attachment member 6A used in the first embodiment. Although some of the structural elements of the seed pin 4B, the couplings 5B1 and 5B2, the cap 7B, and the attachment member 6B of the second embodiment are not illustrated, they correspond to the structural elements of the seed pin 4A, the couplings 5A1 and 5A2, the cap 7A, and the attachment member 6A of the first embodiment, respectively, wherein the structural elements of the present embodiment have corresponding reference symbols each including "B" instead of "A" as a part of the symbol or as a subscript.

At the bottom portion of the chuck body 3B formed in a generally cylindrical shape is provided an insertion hole 3HB1 which extends upward from the bottom surface of the chuck body 3B. A seed crystal S is fixed to the chuck body 3B by inserting the seed pin 4B into the chuck body 3B after insertion of the seed crystal S into the insertion hole 3HB1.

In the top portion of the chuck body 3B is provided an insertion hole 3HB2 which extends downward from the upper surface of the chuck body 3B. On the inside surface of the insertion hole 3HB2 is formed a male thread 3SB1. The insertion holes 3HB1 and 3HB2 may communicate with each other or may be blind holes independent of each other.

At the bottom portion of the holder 8 formed in a generally cylindrical shape, there is provided a cylindrical projection 8M which has a diameter smaller than that of the bottom portion and which projects downward from the bottom portion. A male thread 8SB2 is formed on the outer circumference of the projection 8M. Therefore, the holder 8 can be attached to the upper portion of the chuck body 3B by bringing the male thread 8SB2 of the projection 8M into screw engagement with the female thread 3SB1 of the insertion hole 3HB2 of the chuck body 3B and by tightening the holder 8.

In the upper portion of the holder 8 are formed a concaved portion 8HB1 which extends downward from the upper surface of the holder 8 to have a dish-like or ring-like cross section, and a concaved portion 8HB2 which has a blind-hole-like shape and extends downward from the concaved portion 8HB2. A female thread 8SB1 is formed on the inside surface of the concaved portion 8HB2.

Accordingly, the tip end of the cable 1 can be attached to the chuck body 3B in the same manner as in the first embodiment. That is, the spherical portion 9B and the crimp portion 10B of the attachment member 6B, which has been attached to the tip end of the cable 1 through crimping operation, are sandwiched between the couplings 5B1 and 5B2 so as to be accommodated within a generally cylindrical space which is formed by the conical hole sections 11CB and the accommodation hole sections 12HB of the couplings 5B1 and 5B2. The couplings 5B1 and 5B2 are brought into close contact with each other, and the male threads 12SB formed on the outer circumference of the tail portions of the couplings 5B1 and 5B2 are brought into screw engagement with the female thread 8SB2 formed on the inner surface of the concaved portion 8HB2 of the holder 8. Subsequently, the couplings 5B1 and 5B2 are tightened, whereby the tip of the cable 1 can be attached to the chuck body 3B.

For the same reason as that in the first embodiment, a cap 7B is attached to the couplings 5B1 and 5B2. The cap 7B has a cable hole 7HB1 which penetrates the cap 7B and a concaved portion 7HB2 which has a dish-like or ring-like shape and which faces downward. The cap 7B is fitted onto the upper portions of the couplings 5B1 and 5B2 so as to fix the upper portions of the couplings 5B1 and 5B2, and to bear the horizontal component force, which acts on the couplings 5B1 and 5B2 due to the wedging of the spherical portion 9B. This structure improves safety.

The crystal pulling apparatus of the second embodiment provides the same action and effects as those of the first embodiment. Therefore, the crystal pulling apparatus of the present embodiment can prevent generation of "deflection" which would otherwise be produced during the operation for pulling a single crystal.

Further, since the weight of the holder 8 acts onto the seed chuck 2B, a downward force can be applied to the seed chuck 2B even in an initial stage in which a single crystal has not grown much. Therefore, when the cable 1 has a "bend" even in such an initial stage, the seed chuck 2B can be maintained such that its center line lies on the vertical direction.

Moreover, even when the chuck body 3B is exchanged for some reason, for example, due to the deterioration, it is unnecessary to remove the portion connected to the couplings. Therefore, the operation of exchanging the chuck body 3B becomes easier compared to the case of the first embodiment.

The chuck body 3A or the chuck body 3B and the holder 8 in the above-described embodiments serve as a seed crystal holder which is attached to the cable so as to hold a seed crystal.

The chuck body 3B serves as a first member, while the holder 8 serves as a second member.

The attachment member 6A or 6B serves as an attachment. The couplings 5A1 and 5A2 or 5B1 and 5B2 serve as a support member.

The generally cylindrical space formed by the conical hole sections 11CA1 and 11CA2 (not illustrated) and the accommodation hole sections 12HA1 and 12HA2 (not illustrated) of the couplings 5A1 and 5A2 or the generally cylindrical space formed by the conical hole sections 11CB and the accommodation hole sections 12HB of the couplings 5B1 and 5B2 serves as an accommodation space.

Also, the conical hole sections 11CA1 and 11CA2 (not illustrated) of the couplings 5A1 and 5A2 or the conical hole sections 11CB of the couplings 5B1 and 5B2 serve as the shoulder portion of the accommodation space.

The present invention is not limited to the above-described embodiments. The above-described embodiments are mere examples, and those having the substantially same structure as that described in the appended claims and providing the similar action and effects are included in the scope of the present invention.

For example, the above embodiments are described while mentioning a semiconductor such as silicon as a material from which a single crystal is obtained. However, the present invention is not limited thereto, and other crystalline materials may be used.

In the above-described embodiments, the chuck body of the seed chuck is made of a carbon material, the seed pin is made of a carbon-fiber-reinforced carbon composite material, and the couplings and the like are made of a metal such as molybdenum. However, the present invention is not limited thereto. The above-described parts may be made of other materials, provided that the materials can endure the high temperature of a melt, have sufficient strength to support the weight of a single crystal to be pulled, and have properties which neither introduce impurities into the melt or the single crystal nor cause harmful reaction. For example, molybdenum, tungsten and the like can be used among metallic materials, and carbon-based materials such as graphite and carbon-fiber-reinforced carbon composite material and ceramics materials such as nitride ceramics and carbide ceramics may be used.

In the above-described embodiments, the crimp portion of the attachment member which is fixed to the tip of a cable is formed integrally with the spherical portion. However, the present invention is not limited thereto, and the crimp portion may be manufactured separately from the spherical portion.

In the above-described embodiments, the spherical portion is provided above the crimp portion as an attachment member. However, the present invention is not limited thereto, and what is required is that a portion near the cable has a spherical surface. For example, a semi-spherical member having a spherical surface only at the upper portion thereof may be used. Alternatively, the portion near the cable may be a spheroid whose axis of rotation symmetry coincides with the center line of the cable or may have a convex surface of revolution whose axis of rotation symmetry coincides with the center line of the cable.

In the above-described embodiment, the crimp portion has a cylindrical shape. However, the present invention is not limited thereto, and the crimp portion may be a tubular member having a polygonal cross section such as a triangular cross section, a rectangular cross section or a pentagonal cross section, or a tubular member having an elliptic cross section or any other cross section. The bottom of the tube may be opened or closed.

In the above-described embodiments, the portions of the couplings for supporting the spherical portion have a conical surface. However, the present invention is not limited thereto. The portions may have a semi-spherical surface, an ellipsoidal surface of revolution whose axis of rotation symmetry coincides with the center line of the cable, or a surface of revolution whose axis of rotation symmetry coincides with the center line of the cable.

In the above-described embodiments, the couplings are formed by bisecting a generally bolt-shaped member. However, the present invention is not limited thereto, and the number of division may be 3 or more. Further, the bolt-shaped member may be divided unequally.

In the above-described embodiments, the spherical portion is fixed to the cable via the crimp portion. However, the present invention is not limited thereto, and the spherical portion or a portion which supports the spherical portion from the lower side thereof may be attached to the cable in any other way. For example, other types of mechanical connection such as bolt joint and screw engagement, and other types of joint, other than mechanical connection, such as joint through fusion may be employed.

What is claimed is:

1. A crystal pulling apparatus comprising:

a seed crystal holder for holding a seed crystal;

a cable which is vertically movable above a melt of a crystalline material and is connectable to said seed crystal holder, said cable being moved downward so as to cause said seed crystal to contact said melt and subsequently being pulled so as to grow a single crystal of said crystalline material;

an attachment attached to said cable in the vicinity of a tip thereof, said attachment having a surface of revolution whose axis of rotation symmetry coincides with a center line of said cable; and a support member that connects said cable to said seed crystal holder, said support member comprising a plurality of members combinable about a longitudinal axis of said support member, said support member being detachably attached to said seed crystal holder, said support member having an accommodation space to accommodate said cable and said attachment, and a shoulder portion of said accommodation space contacting said attachment.

2. A crystal pulling apparatus according to claim 1, wherein:

said attachment has a crimp portion fixed to said cable in the vicinity of the tip thereof through crimping, and a spherical portion which is attached to said cable through said crimp portion;

said support member comprises two members, and said support member is removably attached through screw engagement to an upper portion of said seed crystal holder; and the shoulder portion has the shape of a truncated cone.

3. A crystal pulling apparatus according to claim 2, wherein said seed crystal holder comprises first and second members, said first member being adapted to hold said seed crystal, said second member being detachably attached to the upper portion of said first member through screw engagement, and said support member being detachably attached to the upper portion of said second member through screw engagement.

4. The crystal pulling apparatus according to claim 1, wherein the support member is formed by a method comprising:

chucking a plurality of square-bar-like members together;

machining the chucked members such that the chucked members together have a cylindrical shape; and providing a cable hole in the members such that, when the members are assembled into the cylindrical shape, the cable hole is formed.

5. The crystal pulling apparatus according to claim 1, further comprising a cap member that fits onto an upper portion of the support member to secure the plurality of members of the support member against a horizontal force component.

* * * * *